United States Patent
Geypen

(10) Patent No.: US 10,401,739 B2
(45) Date of Patent: Sep. 3, 2019

(54) METHOD OF ALIGNING A PAIR OF COMPLEMENTARY DIFFRACTION PATTERNS AND ASSOCIATED METROLOGY METHOD AND APPARATUS

(71) Applicant: ASML NETHERLANDS B.V., Veldhoven (NL)

(72) Inventor: Niels Geypen, Lommel (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/124,492

(22) Filed: Sep. 7, 2018

(65) Prior Publication Data

US 2019/0079410 A1 Mar. 14, 2019

(30) Foreign Application Priority Data

Sep. 13, 2017 (EP) ..................................... 17190810

(51) Int. Cl.
*G03B 27/32* (2006.01)
*G03F 7/20* (2006.01)
*G03F 9/00* (2006.01)

(52) U.S. Cl.
CPC .......... *G03F 7/70633* (2013.01); *G03F 7/705* (2013.01); *G03F 7/70491* (2013.01);
(Continued)

(58) Field of Classification Search
CPC .... G03F 9/7092; G03F 9/7003; G03F 9/7049; G03F 9/7053; G03F 9/7065; G03F 9/7088; G03F 7/70141; G03F 7/70483; G03F 7/70491; G03F 7/705; G03F 7/70508; G03F 7/70516; G03F 7/70616; G03F 7/70625;
(Continued)

(56) References Cited

U.S. PATENT DOCUMENTS 5,229,872 A 7/1993 Mumola
5,296,891 A 3/1994 Vogt et al.
(Continued)

FOREIGN PATENT DOCUMENTS

EP 1628164 2/2006
WO 99-49504 9/1999
(Continued)

*Primary Examiner* — Christina A Riddle
(74) *Attorney, Agent, or Firm* — Pillsbury Winthrop Shaw Pittman LLP

(57) ABSTRACT

A method of aligning a pair of complementary diffraction patterns having a first complementary diffraction pattern and a second complementary diffraction pattern, the pair of complementary diffraction patterns obtained from performance of a metrology process on a structure formed by a lithographic process. The method includes performing at least a fine alignment stage to align the pair of complementary diffraction patterns. The alignment stage includes: interpolating measured values of the first complementary diffraction pattern over at least a portion of a detector area; and minimizing a residual between measured values in the second complementary diffraction pattern and corresponding interpolated values from the interpolation of the first complementary diffraction pattern, by one or both of translation and rotation of the second complementary diffraction pattern.

20 Claims, 6 Drawing Sheets

(52) U.S. Cl.
CPC ...... *G03F 7/70508* (2013.01); *G03F 7/70616* (2013.01); *G03F 9/7092* (2013.01)

(58) Field of Classification Search
CPC ............. G03F 7/70633; G03F 7/70666; G03F 7/70675; G03F 7/70683; G03F 7/70725; G03F 7/70775; G01N 21/9501; G01N 21/47; G01N 21/4788; G01N 21/95607; G01N 21/33; G01N 21/335; G01N 2223/6116; G01N 23/20; G01N 23/2055; G01B 2210/56
USPC ............ 355/52, 53, 55, 67–71, 72, 77; 250/492.1, 492.2, 493.1, 504 R; 356/399–401, 450, 496, 498, 499, 500, 356/508, 509, 513, 521, 614, 615, 616, 356/620, 390; 700/56–59, 61–62; 702/94, 95, 150

See application file for complete search history.

(56) References Cited

U.S. PATENT DOCUMENTS

| | | | |
|---|---|---|---|
| 5,523,193 | A | 6/1996 | Nelson |
| 6,952,253 | B2 | 10/2005 | Lof et al. |
| 9,158,194 | B2 * | 10/2015 | Koolen ............... G03F 1/42 |
| 2006/0066855 | A1 * | 3/2006 | Boef .................. G03F 7/70341 356/401 |
| 2007/0296960 | A1 | 12/2007 | Den Boef et al. |
| 2008/0198380 | A1 | 8/2008 | Straaijer et al. |
| 2009/0168062 | A1 | 7/2009 | Straaijer |
| 2010/0007863 | A1 | 1/2010 | Jordanoska |
| 2010/0328655 | A1 | 12/2010 | Den Boef |
| 2011/0026032 | A1 | 2/2011 | Den Boef et al. |
| 2011/0032500 | A1 | 2/2011 | Straaijer |
| 2011/0043791 | A1 | 2/2011 | Smilde et al. |
| 2011/0102753 | A1 * | 5/2011 | Van De Kerkhof ........................ G01N 21/4788 355/27 |
| 2011/0102793 | A1 | 5/2011 | Straaijer |
| 2011/0188020 | A1 | 8/2011 | Den Boef |
| 2011/0249244 | A1 | 10/2011 | Leewis et al. |
| 2012/0013881 | A1 | 1/2012 | Den Boef et al. |
| 2012/0044470 | A1 | 2/2012 | Smilde et al. |
| 2012/0044495 | A1 | 2/2012 | Straaijer |
| 2012/0123581 | A1 * | 5/2012 | Smilde ............... G03F 7/70483 700/105 |
| 2013/0162996 | A1 | 6/2013 | Straaijer et al. |
| 2013/0258310 | A1 * | 10/2013 | Smilde ............... G03F 7/70633 355/77 |
| 2013/0308142 | A1 | 11/2013 | Straaijer |
| 2015/0227061 | A1 * | 8/2015 | Tinnemans ........... G03F 9/7088 355/53 |
| 2016/0161863 | A1 | 6/2016 | Den Boef et al. |
| 2016/0161864 | A1 | 6/2016 | Middlebrooks et al. |
| 2016/0282282 | A1 | 9/2016 | Quintanilha et al. |
| 2016/0313654 | A1 | 10/2016 | Zeng et al. |
| 2017/0082536 | A1 | 3/2017 | Yeh et al. |
| 2018/0129139 | A1 | 5/2018 | Jiang et al. |
| 2018/0173111 | A1 * | 6/2018 | Pandey ............... G03F 7/7085 |

FOREIGN PATENT DOCUMENTS

| | | |
|---|---|---|
| WO | 2011-012624 | 2/2011 |
| WO | 2016-150957 | 9/2016 |

\* cited by examiner

METHOD OF ALIGNING A PAIR OF COMPLEMENTARY DIFFRACTION PATTERNS AND ASSOCIATED METROLOGY METHOD AND APPARATUS

This application claims priority to European patent application no. EP17190810, filed Sep. 13, 2017, which is incorporated herein in its entirety.

FIELD

The present description relates to methods and apparatus for metrology usable, for example, in the manufacture of devices by a lithographic technique and to methods of manufacturing devices using a lithographic technique.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimizations of the design layout such as optical proximity correction (OPC) in the design layout, or other methods generally defined as "resolution enhancement techniques" (RET). Alternatively, tight control loops for controlling a stability of the lithographic apparatus may be used to improve reproduction of the pattern at low k1.

In a metrology technique, overlay measurement results are obtained by measuring a target twice under certain conditions, while either rotating the target or changing the illumination mode or imaging mode to obtain separately the −1st and the +1st diffraction order intensities. The intensity asymmetry, a comparison of these diffraction order intensities, for a given target provides a measurement of target asymmetry, that is asymmetry in the target. This asymmetry in the target can be used as an indicator of overlay (undesired misalignment of two layers).

SUMMARY

In some metrology devices, which produce a dark field image of a target using visible measurement radiation, intensity asymmetry is typically determined from intensity values averaged over a region of interest. However, this is not practical for a metrology device that uses EUV measurement radiation and projection optics having a low numerical aperture, particularly when the measurement radiation comprises more than one wavelength. Averaging the measured signal on a metrology tool such as that means that information contained in the diffracted orders will be averaged out and thus lost. Multiple wavelengths are measured to increase sensitivity to parameters of interest and this sensitivity significantly decreases by averaging over all wavelengths. However, for a metrology device that uses EUV measurement radiation and projection optics having a low numerical aperture, there tends to be a significant intensity gradient across the detector. The significant intensity gradient means that accurate alignment (e.g., sub-pixel alignment) of the measured diffraction patterns is significant so that the intensity values can be compared on a sub-pixel basis.

Disclosed is an improved method of aligning diffraction patterns for sub-pixel comparison.

In an aspect, there is provided a method of aligning a pair of complementary diffraction patterns comprising a first complementary diffraction pattern and a second complementary diffraction pattern, the pair of complementary diffraction patterns obtained from performance of a metrology process on a structure formed by a lithographic process; the method comprising performing at least a fine alignment stage to align the pair of complementary diffraction patterns, wherein the fine alignment stage comprises: interpolating measured values of the first complementary diffraction pattern over at least a portion of a detector area; and minimizing a residual between measured values in the second complementary diffraction pattern and corresponding interpolated values from the interpolation of the first complementary diffraction pattern, by one or both of translation and rotation of the second complementary diffraction pattern.

In an aspect, there is provided a method of measuring a parameter of interest of a structure formed on a substrate in a lithographic process comprising: illuminating the structure with measurement radiation; detecting a complementary pair of diffraction orders following diffraction of the measurement radiation by the structure, to obtain a pair of complementary diffraction patterns comprising a first complementary diffraction pattern and a second complementary diffraction pattern; aligning the pair of complementary diffraction patterns by performing a method as described herein; and determining a value for the parameter of interest by a comparison of one or more aligned pairs of measured values, each pair of measured values comprising one of the measured values of the first complementary diffraction pattern and one of the measured values of the second complementary diffraction pattern.

In an aspect, there is provided a metrology apparatus comprising: a support for a substrate, the substrate having a structure formed thereon using a lithographic process; an optical system for illuminating the structure with measurement radiation; a detector for detecting the measurement radiation scattered by the structure; and a processor configured to perform a method as described herein, and/or to control the metrology apparatus to perform a method as described herein.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

a programmable mirror array. More information on such mirror arrays is given in U.S. Pat. Nos. 5,296,891 and 5,523,193, which are incorporated herein in their entireties by reference.

a programmable LCD array. An example of such a construction is given in U.S. Pat. No. 5,229,872, which are incorporated herein in their entireties by reference.

Figure 1:
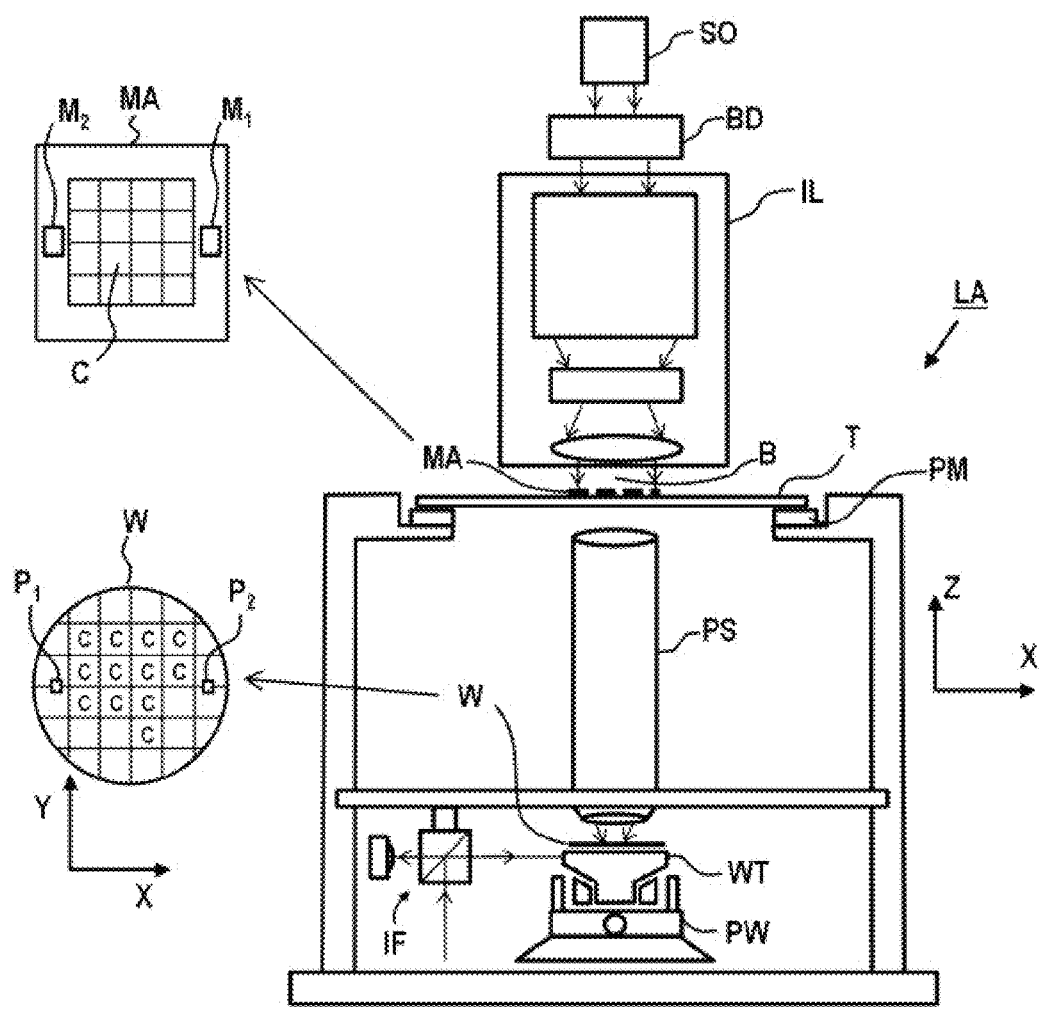
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a support structure (e.g., a mask table) T constructed to support a patterning device (e.g., a mask) MA and connected to a first positioner PM configured to accurately position the patterning device MA in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illuminator IL receives a radiation beam from a radiation source SO, e.g. via a beam delivery system BD. The illumination system IL may include various types of optical components, such as refractive, reflective, magnetic, electromagnetic, electrostatic, or other types of optical components, or any combination thereof, for directing, shaping, or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate may be covered by a liquid having a relatively high refractive index, e.g., water, so as to fill a space between the projection system and the substrate—which is also referred to as immersion lithography. More information on immersion techniques is given in U.S. Pat. No. 6,952,253 and in PCT publication No. WO99-49504, which are incorporated herein in their entireties by reference.

The lithographic apparatus LA may also be of a type having two (dual stage) or more substrate tables WT and, for example, two or more support structure T (not shown). In such "multiple stage" machines the additional tables/structures may be used in parallel, or preparatory steps may be carried out on one or more tables while one or more other tables are being used for exposing the design layout of the patterning device MA onto the substrate W.

In operation, the radiation beam B is incident on the patterning device (e.g., mask MA), which is held on the support structure (e.g., mask table T), and is patterned by the patterning device MA. Having traversed the mask MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and possibly another position sensor (which is not explicitly depicted in FIG. 1) may be used to accurately position the mask MA with respect to the path of the radiation beam B. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks).

Figure 2:
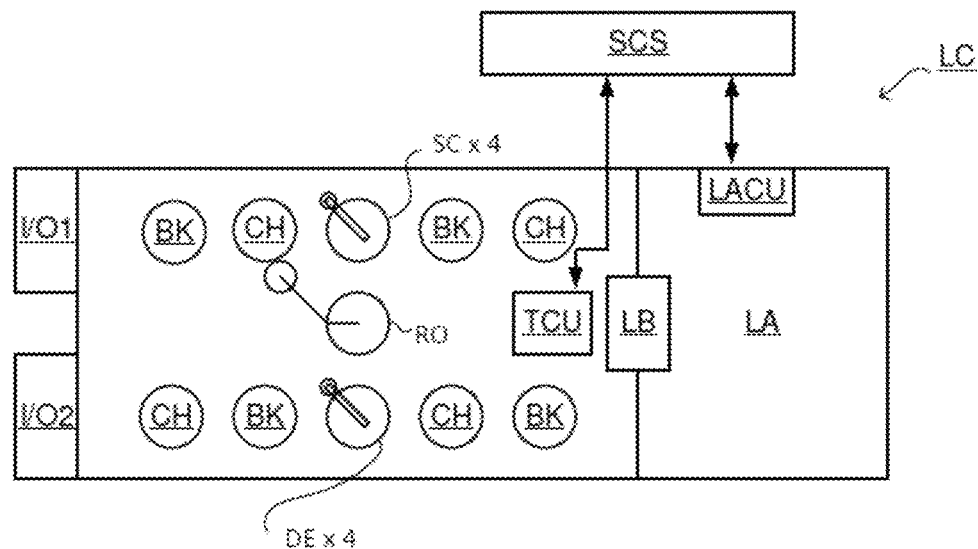
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include one or more spin coaters SC to deposit resist layers, one or more developers DE to develop exposed resist, one or more chill plates CH and/or one or more bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatuses and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure one or more properties of patterned structures, such as overlay errors between subsequent layers, line thicknesses, critical dimensions (CD), etc. For this purpose, one or more inspection tools (not shown) may be included in the lithocell LC. If an error is detected, one or more adjustments, for example, may be made to exposures of subsequent substrates and/or to other processing steps that are to be performed on the substrates W, especially if the inspection is done before other substrates W of the same batch or lot are still to be exposed or processed.

An inspection apparatus, which may also be referred to as a metrology apparatus, is used to determine one or more properties of the substrates W, and in particular, how values of the one or more properties of different substrates W vary or how values of one or more properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the one or more properties on a latent image (image in a resist layer after the exposure), or on a semi-latent image (image in a resist layer after a post-exposure bake step PEB), or on a developed resist image (in which the exposed or unexposed parts of the resist have been removed), or on an etched image (after a pattern transfer step such as etching).

Figure 3:
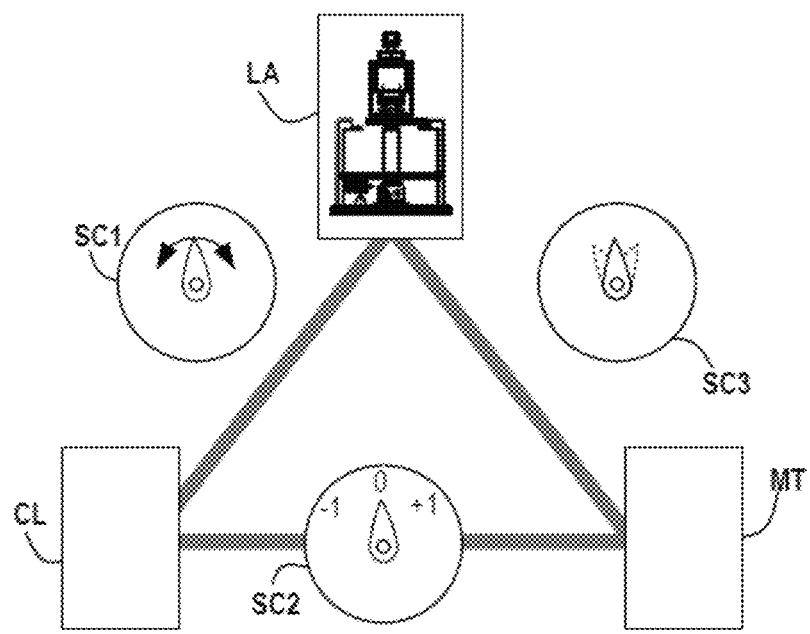
FIG. 3 depicts a schematic representation of a cooperation between three technologies to help optimize device manufacturing.

Typically the patterning performed in a lithographic apparatus LA is one of the most significant steps in the device manufacturing process and involves high accuracy of dimensioning and placement of structures on the substrate W. To help ensure this high accuracy, three systems may be combined in a control environment as schematically depicted in FIG. 3. One of these systems is the lithographic apparatus LA which is (virtually) connected to a metrology tool MT (a second system) and to a computer system CL (a third system). The environment aims to optimize the cooperation between these three systems to enhance the overall process window and provide tight control loops to help ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which one or more resolution enhancement techniques to use and to perform computational lithography simulations and calculations to determine which patterning device pattern layout and lithographic apparatus settings help achieve the largest overall process window of the patterning process (depicted in FIG. 3 by the double arrow in the first scale SC1). Typically, the one or more resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequent measurements of the structures created, e.g., for process control and verification. Tools to make such measurement are typically called metrology tools MT. Different types of metrology tools MT for making such measurements are known, including scanning electron microscopes or various forms of scatterometer metrology tools. Scatterometers are versatile instruments which allow measurements of the parameters of a lithographic process by having a sensor in the pupil or a conjugate plane with the pupil of the objective of the scatterometer, measurements usually referred to as pupil based measurements, or by having the sensor in the image plane or a plane conjugate with the image plane, in which case the measurements are usually referred to as image or field based measurements. Such scatterometers and the associated measurement techniques are further described in U.S. patent application publication nos. US 2010-0328655, US 2011-102753, US 2012-0044470, US 2011-0249244, and US 2011-0026032 and European patent application publication no. EP 1,628,164, each of which is incorporated herein in its entirety by reference. The aforementioned scatterometers may measure gratings using radiation from soft x-ray and visible to near-IR wavelength range.

In a first embodiment, the scatterometer MT is an angular resolved scatterometer. In such a scatterometer reconstruction methods may be applied to the measured signal to reconstruct or calculate one or more properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such a spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis (RCWA) and non-linear regression or by comparison with a library of simulated spectra.

In a third embodiment, the scatterometer MT is an ellipsometric scatterometer. The ellipsometric scatterometer allows for determining one or more parameters of a lithographic process by measuring scattered radiation for each of a plurality of polarization states. Such metrology apparatus emits polarized radiation (such as linear, circular, or elliptic) by using, for example, one or more appropriate polarization filters in the illumination section of the metrology apparatus. A source suitable for the metrology apparatus may provide polarized radiation as well. Various embodiments of ellipsometric scatterometers are described in US patent application publication nos. US 2007-0296960, US 2008-0198380, US 2009-0168062, US 2010-0007863, US 2011-0032500, US 2011-0102793, US 2011-0188020, US 2012-0044495, US 2013-0162996 and US 2013-0308142, each of which is incorporated herein in its entirety by reference.

EUV Spectroscopic Reflectometry

Figure 4:
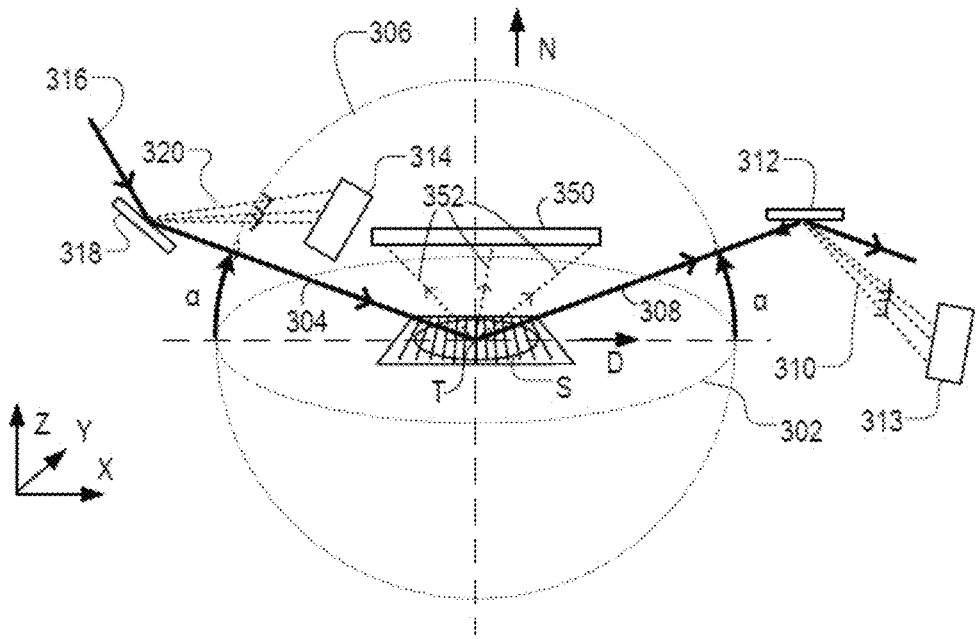
FIG. 4 schematically depicts a metrology method using EUV radiation.
Figure 5:
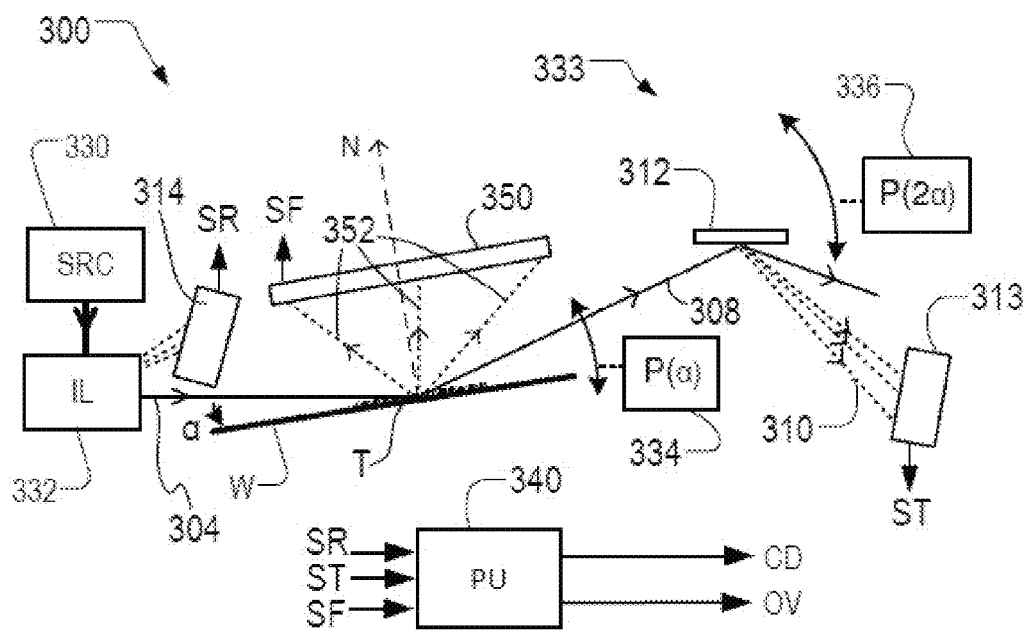
FIG. 5 schematically depicts an EUV metrology device according to an embodiment of the invention.

FIG. 4 schematically illustrates an EUV metrology method while FIG. 5 schematically illustrates an EUV metrology apparatus 300. The apparatus can be used as an example of EUV metrology apparatus for measuring one or more parameters of substrates W processed in the manufacturing system of FIG. 1. The measurement radiation used by EUV metrology apparatus may comprise radiation in the wavelength range from 0.1 to 100 nm, or, optionally, in the wavelength range from 1 to 100 nm or, optionally, in the wavelength range from 1 to 50 nm, or optionally, in the wavelength range from 10 to 20 nm.

In FIG. 4, the target T is represented schematically as comprising a one-dimensional grating structure at the origin of a spherical reference frame. Axes X, Y and Z are defined relative to the target. (Of course any arbitrary coordinate system can be defined in principle, and each component may have its own local reference frame, that can be defined relative to the one shown.) The direction of periodicity D of the target structure is aligned with the X axis. The drawing is not a true perspective drawing, but a schematic illustration only. The X-Y plane is the plane of the target and substrate, and for clarity is shown tilted toward the viewer, represented by an oblique view of circle 302. The Z direction defines the direction N normal to the substrate. In FIG. 4, one of the incident rays is labeled 304 and has an angle α of grazing incidence. In this example, the incident ray 304 (and all incident rays forming the radiation spot S) lie substantially in a plane parallel to the X-Z plane, that is a plane defined by the directions D and N and represented by circle 306. A reflected ray 308 that is not scattered by the periodic structure of the target T emerges towards the right hand side of the target in the diagram, with an elevation angle α.

To perform spectroscopic reflectometry, ray 308 and other reflected rays are broken into a spectrum 310, comprising rays of different wavelengths. The spectrum may be produced for example using a grazing incidence diffraction grating 312. The spectrum is detected by a spectrum detector 313. This spectrum detector 313, which may for example be a CCD image detector having an array of pixels, is used to transform the spectrum into electrical signals and eventually digital data for analysis.

In addition to spectrum 310, higher (non-zero) diffraction orders 352 (e.g., at least the +1 and −1 orders, and possibly other higher orders) may be detected using a diffraction order detector 350. While one diffraction order detector 350 is shown here, more than one higher order detector may be used; for example, a first higher order detector for the +1 order, and a second higher order detector for the −1 order. Diffraction order detector 350 may for example be a CCD image detector having an array of pixels.

In a practical system, the spectrum of radiation 304 may be subject to time variations, which would disturb the analysis. In order to normalize the detected spectrum 310 and/or higher diffraction orders 352 against these variations, a reference spectrum is captured by a reference spectrum detector 314. To produce the reference spectrum, source radiation 316 is diffracted by another diffraction grating 318. A zero order reflected ray of grating 318 forms the incident ray 304, while the first order diffracted rays 320 of grating 318 form the reference spectrum detected by reference spectrum detector 314. Electrical signals and data representing the reference spectrum are obtained for use in the analysis.

From the measured spectrum 310 and/or higher diffraction orders 352, obtained for one or more values of incidence angle α, a measurement of a property of the target structure T can be calculated in a manner described further below.

Turning to FIG. 5, EUV metrology apparatus 300 is provided for measuring one or more properties of a metrology target T formed on substrate W, by the method of FIG. 4. Various hardware components are represented schematically. The practical implementation of these components can be performed by relevant skilled persons applying a mixture of existing components and specially-designed components, according to known design principles. A support (not shown in detail) is provided for holding the substrate at a desired position and orientation relative to other components to be described. A radiation output 330 (e.g., a radiation source) provides radiation to an illumination system 332. Illumination system 332 provides a beam of EUV measurement radiation represented by ray 304 which forms a focused irradiation spot on target T. Illumination system 332 also provides the reference spectrum 320 to reference spectrum detector 314. Components 312, 313 etc. may be conveniently considered as a spectrum detection system 333.

The substrate W in this example is mounted on a movable support having a positioning system 334 such that an angle of incidence a of ray 304 can be adjusted and/or the x, y, z position of the substrate W can be adjusted. In this example, it is chosen as a matter of convenience to tilt the substrate W to change the incidence angle, while the output 330 and illumination system 332 remain stationary. In order to catch the reflected ray 308, detection system 333 is provided with a further movable support 336, so that it moves through an angle 2α relative to the stationary illumination system, or through an angle α relative to the substrate. In the grazing incidence regime of reflectometry, it is convenient to define the incidence angle α by reference to the plane of the substrate, as shown. Of course, it could equally be defined as an angle between the direction of incidence of incident ray I and a direction N normal to the substrate.

Additional actuators, not shown, are provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detectors 313, 350 stay still, or whether the substrate stays still while the illumination system and detectors 313, 350 are moved, or whether different components of the relative movement are achieved by a combination of these techniques. The present disclosure encompasses all these variants.

As already described with reference to FIG. 4, the radiation reflected by target T and substrate W is split into a spectrum 310 of rays of different wavelengths, before it impinges on spectrum detector 313. Spectrum detector 313 and/or diffraction order detector 350 comprises for example a position-sensitive EUV detector, typically an array of detector elements. In each case, the array may be a linear array, but in practice a 2-dimensional array of elements (pixels) may be provided. Spectrum detector 313 and/or diffraction order detector 350 may be for example a CCD (charge coupled device) image sensor.

A processor 340 receives signals from the detectors 350, 313 and 314. In particular, signal ST from spectrum detector 313 represents the target spectrum, signals SF from diffraction order detector 350 represents the higher order diffraction patterns and signal SR from detector 314 represents the reference spectrum. Processor 340 can subtract the reference spectrum from the target spectrum to obtain a reflection spectrum of the target, normalized against variation in the source spectrum. The resulting reflection spectra for one or more angles of incidence are used in the processor to calculate a measurement of a property of the target, for example CD or overlay. Similarly, processor 340 can subtract the reference spectrum from the higher diffraction order patterns (spectra) 352 to obtain higher order diffraction patterns which are normalized against variation in the source spectrum. These higher diffraction order patterns 352 can be compared in intensity asymmetry measurements to calculate a measurement of a property of the target, for example overlay (OV) or focus.

In practice, radiation from output 330 may be provided in a series of short pulses and signals SR and ST may be captured together for each pulse. Difference signals for each individual pulse are calculated, before being aggregated into an overall reflection spectrum for this target at this angle of incidence. In this way, instability of the source spectrum between pulses is corrected for. The pulse rate may be thousands, or even tens of thousands per second (hertz). The number of pulses aggregated to measure one reflection spectrum may be tens or hundreds, for example. Even with so many pulses, the physical measurement takes a fraction of one second.

Applying this EUV spectroscopic reflectometry to metrology in semiconductor manufacturing, small grating metrology targets can be used. Multiple diffraction spectra are captured using detectors 350, 313 and 314, while setting the grazing angle of incidence a to various different values. Using the spectra detected by spectrum detector 313 and a mathematical model of the target structure, reconstruction calculations can be performed to arrive at measurement of CD and/or one or more other parameters of interest. Alternatively or in addition, complementary higher diffraction orders detected by diffraction order detector 350 may be compared to determine asymmetry in the target structure, and therefore one or more related parameters of interest such as overlay, focus or dose, depending on the target properties.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. The two (typically overlapping) grating structures may be applied in two different layers (not necessarily consecutive layers), and may be formed substantially at the same position on the substrate. The scatterometer may have a symmetrical detection configuration as described e.g. in co-European patent application publication no. EP1,628, 164, which is incorporated herein in its entirety by reference, such that any asymmetry is clearly distinguishable. This provides a straightforward way to measure misalignment in gratings. Further examples for measuring by overlay error between the two layers containing periodic structures as a target as measured through asymmetry of the periodic structures may be found in PCT patent application publication no. WO 2011/012624 or US patent application publication no. US 2016-0161863, each incorporated herein in its entirety by reference.

Figure 6:
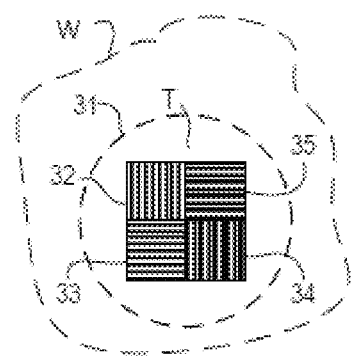
FIG. 6 depicts a form of multiple grating target and an outline of a measurement spot on a substrate.

FIG. 6 shows an exemplary metrology target T on a substrate W, such as which may be used to measure overlay. The target T may comprise an ensemble of composite gratings or sub-targets 32, 33, 34, 35, formed by a lithographic process, mostly in resist, but also after an etch process for example. For overlay applications, the sub-targets 32, 33, 34, 35 may be a pair of similar gratings (same pitch, CD, SWA, etc.) formed on the same position on the substrate in different, but not necessarily consecutive, layers. The metrology apparatus will measure the misalignment between these two overlapping gratings, known as overlay measurement. In an embodiment, the target T may be designed for dark field measurement, using a suitable scatterometer. A dark field target will typically be made smaller than the available illumination spot 31 (a typical target is 5×5 microns squared whereas an illumination spot has a cross-sectional with of, e.g., 35 micrometers). As such there will be sufficient space to use multiple overlay sub-targets 32, 33, 34, 35 which can be measured at the same time, allowing measurements of multiple functionalities. Sub-targets 32, 33, 34, 35 may differ in their orientation, as shown, so as to diffract incoming radiation in X and Y directions. In the specific example illustrated, sub-targets 32 and 34 are X-direction sub-targets with biases of +d, −d, respectively, and sub-targets 33 and 35 are Y-direction sub-targets with offsets +d and −d respectively. Alternatively, measurement in only one direction would require only half the sub-targets, i.e., only those corresponding to that direction. While four sub-targets are illustrated, another embodiment may include a larger matrix to obtain desired accuracy. For example, a 3×3 array of nine composite sub-targets may have biases −4d, −3d, −2d, −d, 0, +d, +2d, +3d, +4d. Separate images of these sub-targets can be identified in the image captured by detection system.

In an embodiment, asymmetry of the target, and hence, e.g., overlay, can then be determined. This may be done using an image processor and a controller by comparing the intensity values obtained for +1 and −1 orders (or other complementary higher orders) for each periodic structure 32-35 to identify any difference in their intensity, i.e., an intensity asymmetry. The term "difference" is not intended to refer only to subtraction. Differences may be calculated in ratio form or in sum form. The measured intensity asymmetries for a number of periodic structures are used together with, if applicable, knowledge of the overlay biases of those periodic structures to calculate one or more performance parameters of the lithographic process in the vicinity of the target T. A performance parameter of interest is overlay. One or more other parameters of performance of the lithographic process can be calculated such as focus and/or dose. The one or more performance parameters can be fed back for improvement of the lithographic process, used to improve the measurement and calculation process of the scatterometer itself and/or used to improve the design of the target T, for example.

More specifically, using for example the method described in PCT patent application publication no. WO 2011/012624 or US patent application publication no. US 20160161863, each incorporated herein in its entirety by reference, overlay between the two layers containing the sub-targets 32 to 35 may be measured by a method comprising the following steps. In an initial step, the substrate, for example a semiconductor wafer, is processed through the lithographic cell of FIG. 2 one or more times, to create a structure including the target comprising periodic structures 32-35. In a next step, a first diffraction pattern from the periodic structures 32 to 35 is obtained using one of the first order diffracted beams (say—1). In an embodiment, a first illumination mode is used. Then, whether by, for example, changing the illumination mode, or changing the imaging mode, or by rotating substrate W by 180° in the field of view of the metrology apparatus, a second diffraction pattern from the periodic structures using the other first order diffracted beam +1 is obtained. Consequently, the +1 diffracted radiation is captured in the second image. In an embodiment, the illuminated mode is changed and a second illumination mode is used. In an embodiment, tool-induced artifacts like tool induced shift (TIS) can be removed by doing the measurement at 0° and 180° substrate orientation. The first and second diffraction patterns are then compared, e.g., by calculating the differences of intensity levels within diffraction patterns of each sub-target.

A consideration in overlay metrology is that the radiation scattered from the target contains not only overlay information, but also information about the degree of process induced structural asymmetry. The contribution of the process induced structural asymmetry is often seen as detrimental to an accurate measurement of a parameter of interest, such as overlay. US patent application publication nos. US 2016-0313654, US 2016-0161864, US 2013-0258310, US 2012-0013881, and US 2018-0129139, each incorporated herein in its entirety by reference, comprise methods of distinguishing the process induced asymmetry contribution to the measured intensity.

In equation terms, the relationship between overlay $OV_E$ and intensity asymmetry A, in the absence of a process induced asymmetry contribution is assumed to be:

$$A_{\pm d} = K_1 \sin(OV_E \pm d) \quad (1)$$

where overlay $OV_E$ is expressed on a scale such that the target pitch P corresponds to an angle $2\pi$ radians. By using two measurements of gratings with different, known biases (e.g. +d and −d), as already described, the overlay $OV_E$ can be calculated using:

$$OV_E = \operatorname{atan}\left(\frac{A_{+d} + A_{-d}}{A_{+d} - A_{-d}} \cdot \tan(d)\right) \quad (2)$$

A first effect of introducing a process induced asymmetry contribution, for example a bottom grating asymmetry, is that the 'ideal' sinusoidal curve of equation (1) no longer applies. However, at least approximately, bottom grating asymmetry or other process induced asymmetry has the effect of adding an intensity shift term $K_0$ and a phase shift term $\phi$ to the intensity asymmetry $A_{\pm d}$. This intensity shift term $K_0$ and phase shift term $\phi$ are dependent upon a combination of the target and a selected characteristic of the measurement radiation, such as the wavelength and/or polarization and/or angle of incidence of the measurement radiation, and is sensitive to process variations. In equation terms, the relationship used for calculation overlay becomes:

$$A_{\pm d} = K_0 + K_1 \sin(OV_E \pm d + \phi) \quad (3)$$

Other methods may find it sufficient to ignore the phase shift term $\phi$ and correct for only the intensity shift term $K_0$. In any case, to calculate overlay $OV_E$ now involves additional measurements. e.g., of additional sub-targets with e.g., different biases and/or using measurement radiation of a different characteristic, so that these additional term(s) can be cancelled or corrected for. Using additional sub-targets is unattractive as it means more patterning device/substrate area for the additional sub-targets. Therefore, metrology apparatuses, such as already described in relation to FIG. 6, may be adapted to measure a target using measurement radiation having more than one characteristic e.g., having different wavelengths and/or polarizations and/or angle of incidences. Such an apparatus may be able to make simultaneous multiple measurements with measurement radiation having different characteristics e.g., using broadband or multiple wavelength measurement radiation, thereby reducing measurement time.

In dark field metrology devices such as those described in the aforementioned earlier patent application publications, intensity asymmetry measurements are performed using averaged intensity values over a region of interest for each sub-target. This is practical for non-EUV (e.g., visible) wavelength measurement radiation, particularly when the measurements are performed using such radiation of a single wavelength at a time. However, averaging intensities over a region of interest becomes impractical when using EUV measurement radiation, particularly EUV measurement radiation of multiple wavelengths. The projection optics within an EUV metrology device will tend to have a low numerical aperture (NA), which tends to result in a larger intensity gradient over the detected image and therefore large pixel-to-pixel intensity variation. Additionally, the diffracted orders for the different wavelengths will only be separated by a small amount and therefore will overlap (e.g., have overlapping Gaussian tails).

Because of this, the two complementary diffraction patterns (from corresponding higher orders) being compared should be very accurately aligned, e.g., to within a sub-pixel accuracy. Ideally, the alignment should be accurate within an order of magnitude of a 100th of a pixel. The comparison can then be made for corresponding pixels in the two images on a sub-pixel basis. As such, a method of aligning images is proposed.

Disclosed is a method of aligning a pair of complementary images or diffraction patterns comprising a first complementary image or first complementary diffraction pattern (e.g., of the positive diffraction order, for example as measured by diffraction order detector 350) and a second complementary image or second complementary diffraction pattern (e.g., of the negative diffraction order, for example as measured by diffraction order detector 350), where the pair of complementary diffraction patterns is obtained from performance of a metrology process on a structure formed in a lithographic process. The method comprises performing a coarse alignment stage to determine the orientation axes of the pair of complementary diffraction patterns (e.g., by principal component analysis (PCA)) and to align the pair of complementary diffraction patterns to within an accuracy of a pixel or greater; and performing a fine alignment stage to align the pair of complementary diffraction patterns to within a sub-pixel degree of accuracy.

The fine alignment stage may comprise interpolating the intensity variation over the detector for one of the complementary diffraction patterns (e.g., the first complementary diffraction pattern), computing an alignment error between the two complementary diffraction patterns at each of a plurality of sample points of the second complementary diffraction pattern, and using a non-linear solver to reduce or minimize this error by rotation and/or translation of the second complementary diffraction pattern. A proposed method will now be described in greater detail in combination with FIGS. 7, 8 and 9.

Figure 7:
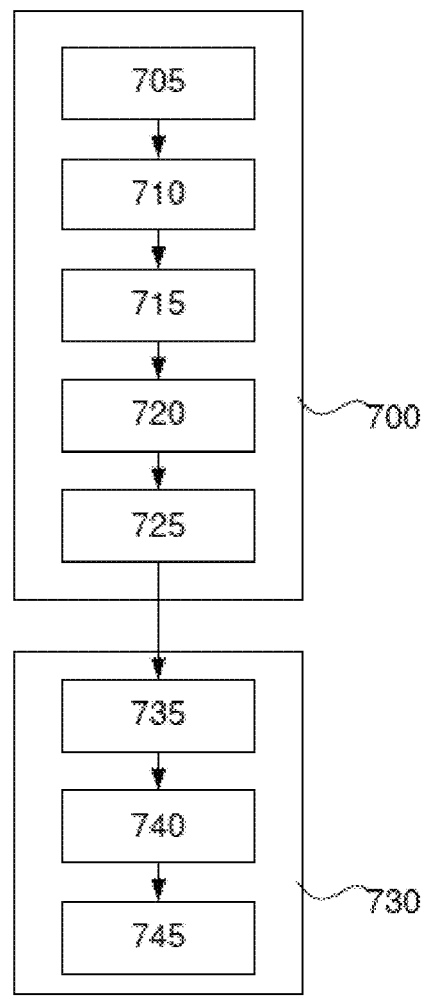
FIG. 7 is a flowchart describing a method of aligning complementary images obtained from performance of a metrology process on a structure formed in a lithographic process, according to an embodiment of the invention.
Figure 8A:
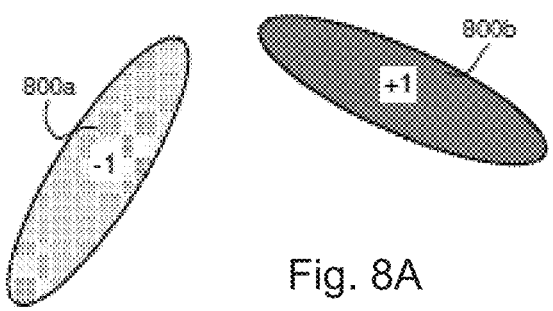
FIGS. 8A, 8B and 8C conceptually illustrate steps of the coarse alignment stage depicted in the flowchart of FIG. 7.

FIG. 7 is a flowchart of a proposed method, while FIG. 8 conceptually illustrates the coarse alignment stage of the method. Referring first to FIG. 7, the coarse alignment stage 700 begins with a step 705 of acquiring the two complementary diffraction patterns, e.g., by performing a measurement on a structure by illuminating the structure and detecting complimentary higher diffraction orders. FIG. 8A shows an example result of step 705 as two complementary diffraction patterns 800a, 800b detected on a detector. In this example, first complementary diffraction pattern 800a corresponds to a diffraction pattern of the −1 diffraction order pattern and second complementary diffraction pattern 800b corresponds to a diffraction pattern of the +1 diffraction order pattern. Each of the complementary diffraction patterns 800a, 800b comprise a plurality of detected intensity values over the detector area within a region of interest (represented by each shaded oval).

Figure 8B:
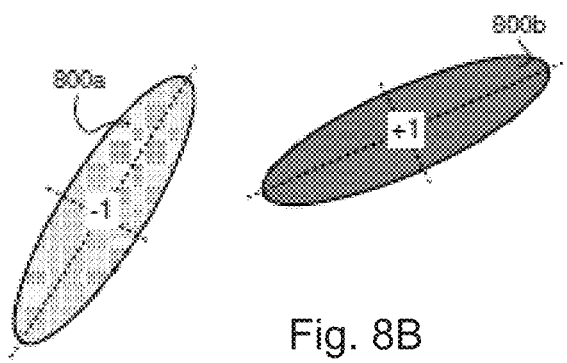

At step 710, one of the complementary diffraction patterns, in this example second complementary diffraction pattern 800b, is mirrored with respect to the pixel grid (as the complementary diffraction patterns 800a, 800b are from opposite orders and therefore mirror each other). Following this, at step 715, the orientation axes of both complementary diffraction patterns 800a, 800b are determined. Step 715 may be performed using PCA. More specifically, for each diffraction pattern 800a, 800b, its centroid may be calculated, and a covariance matrix constructed based on diffraction pattern moments (e.g., second order central moments). The eigenvectors of such a covariance matrix will correspond to the major and minor axes of the diffraction pattern intensity, and hence the orientation axes of each diffraction pattern can be determined. The result of this step is illustrated in FIG. 8B, which shows the second complementary diffraction pattern 800b having been mirrored and the orientation axes of each complementary diffraction pattern 800a, 800b shown.

Figure 8C:
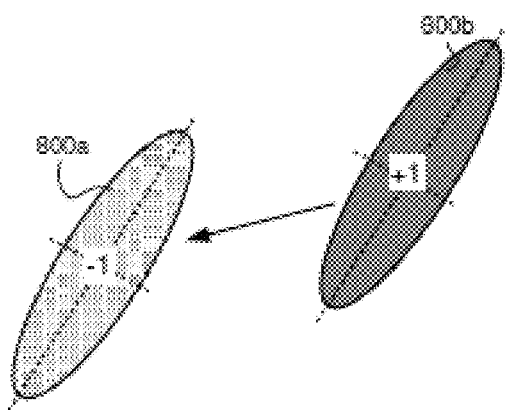

Steps 720 and 725 comprise respectively rotating and/or translating one of the complementary diffraction patterns 800a, 800b onto the other. The order of steps 720 and 725 are not important. With the orientation axes known, steps 720 and 725 are straightforward to perform to approximately a single pixel accuracy. In an embodiment, only a translation may be necessary. FIG. 8C conceptually illustrates these steps 720, 725, with complementary diffraction pattern 800b having been rotated to the same orientation as complementary diffraction pattern 800a, and the arrow signifying the translation step 725.

Figure 9A:
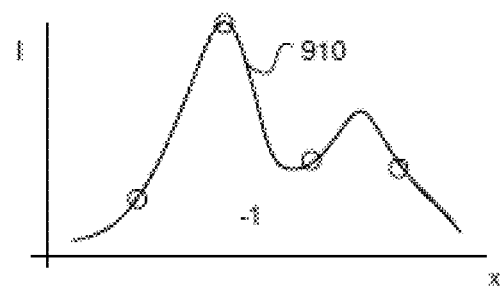
FIGS. 9A, 9B and 9C conceptually illustrate steps of the fine alignment stage depicted in the flowchart of FIG. 7.
Figure 9A:
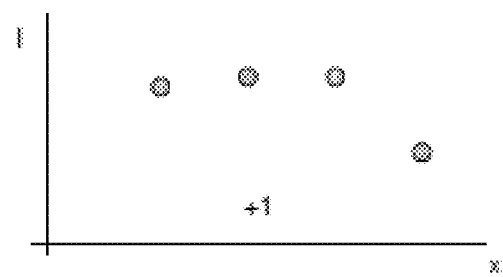
Figure 9B:
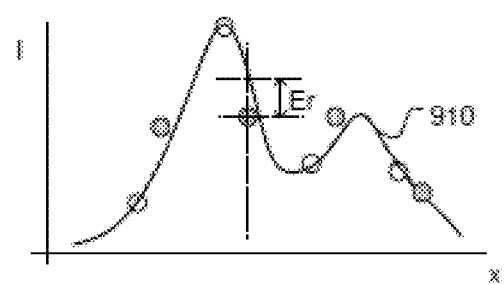
Figure 9C:
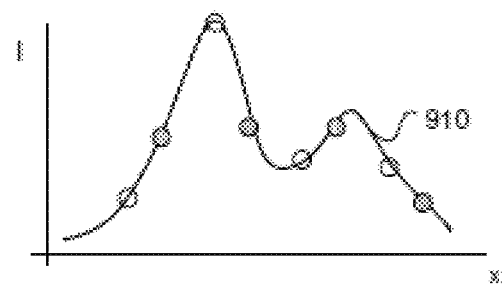

To achieve sub-pixel accuracy, the method uses a fine alignment stage 730, which will be described in combination with FIGS. 9A, 9B and 9C. At step 735, an interpolation through the intensity values of one of the complementary diffraction patterns is performed, in this example first complementary diffraction pattern 800a. This is represented in FIG. 9A, which comprise a first plot (labelled −1) of intensity against pixel location on the detector for the first complementary diffraction pattern 800a, with the interpolation shown as line 910. Also shown is a second plot (labelled +1) of intensity against pixel location on the detector for the second complementary diffraction pattern 800b. Of course, there will be many more sample points than the few illustrated here.

At step 740, an alignment error Er is computed between each sample point of the non-interpolated diffraction pattern (second complementary diffraction pattern 800b), relative to the interpolation 910 of the first complementary diffraction pattern 800a. As such the alignment error Er may comprise a residual between measured intensity of the second complementary diffraction pattern 800b at a sample point and the estimated intensity at a corresponding point according to the interpolation 910 of the first complementary diffraction pattern 800a. Step 740 is illustrated by FIG. 9B which shows the plots of FIG. 9A on the same axes, and the alignment error Er shown for one of the sample points of the second complementary diffraction pattern 800b. The sample points of first complementary diffraction pattern 800a are shown unshaded and the sample points of the second complementary diffraction pattern 800b are shown shaded.

At step 745, a non-linear solver is used to (e.g., iteratively) reduce or minimize this alignment error using only a translation and/or rotation of the non-interpolated diffraction pattern, i.e., second complementary diffraction pattern 800b. The result of step 745 is illustrated in FIG. 9C, which shows the sample points of both complementary diffraction patterns 800a, 800b lying on the same interpolation curve 910. Of course, the measurement principle in intensity asymmetry measurements (such a diffraction based overlay) relies on the fact that there will be a measurable intensity difference between the complementary diffraction patterns 800a, 800b, from which overlay (or other parameter of interest) can be determined. As such, there will always be a residual between the complementary diffraction patterns 800a, 800b. However, diffraction pattern alignment will be optimal when this residual (alignment error) is at a minimum.

While the method is described above in terms of aligning diffraction patterns from the +1 and −1 diffraction orders, it is not limited to this. Other complementary higher diffraction orders (e.g., +2/−2 orders, +3/−3 orders, etc. may be used). The basic diffraction pattern alignment method could also be used to align a detected diffraction pattern or image (e.g., zeroth order or higher order) measured by diffraction order detector 350 or spectrum detector 313 with a corresponding reference detected diffraction pattern (e.g., as detected using the reference detector 314 of FIGS. 4 and 5). In such an application, the method may differ in a number of the implementation details (for example it may not be necessary to mirror one of the detected diffraction patterns or the spectrum). However, aligning the reference spectrum and measured spectrum in this way may be more inaccurate because higher variations in wavelength intensities are to be expected due to the scattering on target T.

It should be appreciated that while the example illustrated in FIG. 9 shows interpolation in 1-dimension, the methods described herein are also applicable to 2-dimensional examples. For example, rather than a 1-dimensional plot as illustrated, an interpolated intensity surface may be obtained for one of the diffraction patterns 800a, 800b. The error will then be reduced or minimized for each corresponding x,y coordinate of the intensity surface by a rotation and/or translation (most probably along sub-pixel distances) of the other diffraction pattern using a non-linear solver in the manner described.

Once the complementary diffraction patterns 800a, 800b are aligned they can be used to determine a parameter of interest (e.g., overlay, focus or dose). Where multiple wavelength measurement radiation is used, a plurality of intensity asymmetry measurements can be obtained from single pairs of diffraction patterns (e.g., single measurements or acquisitions). In such an embodiment, an intensity difference for each of different pairs of aligned pixels (or sub-pixels) from the diffraction patterns is calculated, each pair of aligned pixels corresponding to a different wavelength. In this way, for example, overlay can be determined from a single acquisition while cancelling, suppressing and/or calculating the effect of process induced asymmetry on the measurement.

More embodiments are disclosed in the subsequent numbered clauses:

1. A method of aligning a pair of complementary diffraction patterns comprising a first complementary diffraction pattern and a second complementary diffraction pattern, the pair of complementary diffraction patterns being obtained from performance of a metrology process on a structure formed by a lithographic process;

the method comprising performing at least a fine alignment stage to align the pair of complementary diffraction patterns, wherein the fine alignment stage comprises:

interpolating measured values of the first complementary diffraction pattern over at least a portion of the detector area; and minimizing a residual between measured values in the second complementary diffraction pattern and corresponding interpolated values from the interpolation of the first complementary diffraction pattern, by one or both of translation and rotation of the second complementary diffraction pattern.

2. A method as defined in clause 1, wherein the fine alignment stage aligns the pair of complementary diffraction patterns to within a sub-pixel degree of accuracy.

3. A method as defined in clause 1 or clause 2, comprising using a non-linear solver to minimize the residual.

4. A method as defined in any of clauses 1 to 3, wherein the step of minimizing a residual comprises computing the residual between measured values in the second complementary diffraction pattern and corresponding interpolated values from the interpolation of the first complementary diffraction pattern.

5. A method as defined in any of clauses 1 to 4, wherein the step of minimizing a residual is performed iteratively.

6. A method as defined in any of clauses 1 to 5, comprising performing a coarse alignment stage prior to performing the fine alignment stage.

7. A method as defined in clause 6, wherein the coarse alignment stage comprises determination of the orientation axes of each of the pair of complementary diffraction patterns.

8. A method as defined in clause 7, wherein the determination of the orientation axes is performed using principal component analysis.

9. A method as defined in any of clauses 6 to 8, wherein the coarse alignment stage further comprises a rotation and/or translation step which aligns the first complementary diffraction pattern and the second complementary diffraction pattern.

10. A method as defined in clause 9, comprising an initial step of mirroring a detected diffraction pattern from the metrology process such that one of the first complementary diffraction pattern or second complementary diffraction pattern is a mirrored diffraction pattern of the diffraction pattern initially detected.

11. A method as defined in clause 9 or clause 10, comprising determining a value for a parameter of interest of the structure formed by the lithographic process by a comparison of one or more aligned pairs of measured values, each aligned pair of measured values comprising one of the measured values of the first complementary diffraction pattern and one of the measured values of the second complementary diffraction pattern.

12. A method as defined in clause 11, wherein the parameter of interest comprises one of overlay, focus or dose.

13. A method as defined in any of clauses 1 to 12, wherein the pair of complementary diffraction patterns comprise a detected diffraction pattern following diffraction of measurement radiation by the structure in the metrology process, and a reference diffraction pattern for normalization of the detected diffraction pattern.

14. A method as defined in any of clauses 1 to 13, wherein the measured values of the first complementary diffraction pattern and of the second complementary diffraction pattern each comprise intensity values.

15. A method as defined in any of clauses 1 to 14, wherein the first complementary diffraction pattern and second complementary diffraction pattern are each obtained from complementary higher diffraction orders following diffraction of measurement radiation by the structure in the metrology process.

16. A method of measuring a parameter of interest of a structure formed on a substrate in a lithographic process, the method comprising:

illuminating the structure with measurement radiation;

detecting a complementary pair of diffraction orders following diffraction of the measurement radiation by the structure, to obtain a pair of complementary diffraction patterns comprising a first complementary diffraction pattern and a second complementary diffraction pattern;

aligning the pair of complementary diffraction patterns by performing the method of any of clauses 1 to 15; and determining a value for the parameter of interest by a comparison of one or more aligned pairs of measured values, each pair of measured values comprising one of the measured values of the first complementary diffraction pattern and one of the measured values of the second complementary diffraction pattern.

17. A method as defined in clause 16, wherein the parameter of interest comprises one of overlay, focus or dose.

18. A method as defined in clause 16 or clause 17, wherein the measurement radiation comprises radiation in the wavelength range from 1 to 50 nm.

19. A method as defined in any of clauses 16 to 18, wherein the measurement radiation comprises radiation of different wavelengths.

20. A metrology apparatus comprising:

a support for a substrate, the substrate having a structure formed thereon using a lithographic process;

an optical system for illuminating the structure with measurement radiation;

a detector for detecting the measurement radiation scattered by the structure; and a processor configured to perform the method of any of clauses 1 to 15, and/or to control the metrology apparatus to perform the method of any of clauses 16 to 19.

21. A metrology apparatus as defined in clause 20, wherein the measurement radiation comprises radiation in the wavelength range from 1 to 50 nm.

22. A metrology apparatus as defined in clause 20 or clause 21, wherein the measurement radiation comprises radiation of different wavelengths.

23. A computer program product comprising a non-transitory computer readable medium having instructions recorded thereon, the instructions when executed by a computer implementing a method of any of clauses 1 to 19.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method comprising:
   performing at least a fine alignment stage to align a pair of complementary diffraction patterns, the pair of complementary diffraction patterns comprising a first complementary diffraction pattern and a second complementary diffraction pattern, the pair of complementary diffraction patterns obtained from performance of a metrology process on a structure formed by a lithographic process,
   wherein the fine alignment stage comprises:
      interpolating measured values of the first complementary diffraction pattern over at least a portion of a detector area, and
      minimizing a residual between measured values in the second complementary diffraction pattern and corresponding interpolated values from the interpolation of the first complementary diffraction pattern, by one or both of translation and rotation of the second complementary diffraction pattern.

2. The method as claimed in claim 1, wherein the fine alignment stage aligns the pair of complementary diffraction patterns to within a sub-pixel degree of accuracy.

3. The method as claimed in claim 1, further comprising using a non-linear solver to minimize the residual.

4. The method as claimed in claim 1, wherein the minimizing a residual comprises computing the residual between measured values in the second complementary diffraction pattern and corresponding interpolated values from the interpolation of the first complementary diffraction pattern.

5. The method as claimed in claim 1, wherein the minimizing a residual is performed iteratively.

6. The method as claimed in claim 1, further comprising performing a coarse alignment stage prior to performing the fine alignment stage.

7. The method as claimed in claim 6, wherein the coarse alignment stage comprises determination of orientation axes of each complementary diffraction pattern of the pair of complementary diffraction patterns.

8. The method as claimed in claim 6, wherein the coarse alignment stage further comprises a rotation and/or translation step which aligns the first complementary diffraction pattern and the second complementary diffraction pattern.

9. The method as claimed in claim 8, comprising an initial step of mirroring an initially detected diffraction pattern from the metrology process such that the first complementary diffraction pattern or second complementary diffraction pattern is a mirrored diffraction pattern of the diffraction pattern initially detected.

10. The method as claimed in claim 1, further comprising determining a value for a parameter of interest of the structure formed by the lithographic process by a comparison of one or more aligned pairs of measured values, each aligned pair of measured values comprising one of the measured values of the first complementary diffraction pattern and one of the measured values of the second complementary diffraction pattern.

11. The method as claimed in claim 1, wherein the pair of complementary diffraction patterns comprise a detected diffraction pattern following diffraction of measurement radiation by the structure in the metrology process, and a reference diffraction pattern for normalization of the detected diffraction pattern.

12. The method as claimed in claim 1, wherein the measured values of the first complementary diffraction pattern and of the second complementary diffraction pattern each comprise intensity values.

13. The method as claimed in claim 1, wherein the first complementary diffraction pattern and second complementary diffraction pattern are each obtained from complementary higher diffraction orders following diffraction of measurement radiation by the structure in the metrology process.

14. A method of measuring a parameter of interest of a structure formed on a substrate in a lithographic process, the method comprising:
   illuminating the structure with measurement radiation;
   detecting a complementary pair of diffraction orders following diffraction of the measurement radiation by the structure, to obtain a pair of complementary diffraction patterns comprising a first complementary diffraction pattern and a second complementary diffraction pattern;
   aligning the pair of complementary diffraction patterns by performing the method of claim 1; and
   determining a value for the parameter of interest by a comparison of one or more aligned pairs of measured values, each pair of measured values comprising one of the measured values of the first complementary diffraction pattern and one of the measured values of the second complementary diffraction pattern.

15. The method of claim 14, wherein the parameter of interest is overlay, focus or dose.

16. The method of claim 14, wherein the measurement radiation comprises radiation in the wavelength range of 1 to 50 nm.

17. A non-transitory computer program product comprising machine-readable instructions that, when executed, are configured to cause a computer system to at least:
   perform at least a fine alignment stage to align a pair of complementary diffraction patterns, the pair of complementary diffraction patterns comprising a first complementary diffraction pattern and a second complementary diffraction pattern, the pair of complementary diffraction patterns obtained from performance of a metrology process on a structure formed by a lithographic process, wherein the fine alignment stage comprises:

interpolation of measured values of the first complementary diffraction pattern over at least a portion of a detector area, and minimization of a residual between measured values in the second complementary diffraction pattern and corresponding interpolated values from the interpolation of the first complementary diffraction pattern, by one or both of translation and rotation of the second complementary diffraction pattern.

18. The computer program product of claim 17, wherein the fine alignment stage aligns the pair of complementary diffraction patterns to within a sub-pixel degree of accuracy.

19. The computer program product of claim 17, wherein the instructions are further configured to cause the computer system to determine a value for a parameter of interest of the structure formed by the lithographic process by a comparison of one or more aligned pairs of measured values, each aligned pair of measured values comprising one of the measured values of the first complementary diffraction pattern and one of the measured values of the second complementary diffraction pattern.

20. A metrology apparatus comprising:

a support for a substrate, the substrate having a structure formed thereon using a lithographic process;

an optical system configured to illuminate the structure with measurement radiation;

a detector configured to measurement radiation scattered by the structure; and the computer program product of claim 17.

* * * * *